(12) United States Patent
Feucht

(10) Patent No.: US 8,348,355 B2
(45) Date of Patent: Jan. 8, 2013

(54) ARRANGEMENT FOR SWITCHING VALVES IN AXLE MODULES OF A UTILITY VEHICLE

(75) Inventor: Thomas Feucht, Wimsheim (DE)

(73) Assignee: Knorr-Bremse Systeme Fuer Nutzfahrzeuge GmbH, Munich (DE)

( * ) Notice: Subject to any disclaimer, the term of this patent is extended or adjusted under 35 U.S.C. 154(b) by 547 days.

(21) Appl. No.: 12/451,441

(22) PCT Filed: May 21, 2008

(86) PCT No.: PCT/EP2008/004060
§ 371 (c)(1),
(2), (4) Date: Feb. 23, 2010

(87) PCT Pub. No.: WO2008/145288
PCT Pub. Date: Dec. 4, 2008

(65) Prior Publication Data
US 2011/0043030 A1    Feb. 24, 2011

(30) Foreign Application Priority Data

May 31, 2007    (DE) .......................... 10 2007 025 430

(51) Int. Cl.
*B60T 8/78*    (2006.01)
(52) U.S. Cl. .......................................... 303/199; 303/20
(58) Field of Classification Search .............. 303/3, 199, 303/20, 15; 188/155–161, 163
See application file for complete search history.

(56) References Cited

U.S. PATENT DOCUMENTS

| 5,741,048 | A | * | 4/1998 | Eccleston ...................... 303/7 |
| 5,752,482 | A | | 5/1998 | Roettgen et al. |
| 6,776,461 | B2 | | 8/2004 | Stumpe |

FOREIGN PATENT DOCUMENTS

| DE | 42 05 563 | 8/1993 |
| DE | 196 32 365 | 9/1997 |
| DE | 100 18 515 | 10/2001 |
| DE | 102 01 453 | 5/2003 |
| DE | 103 59 040 | 3/2006 |
| DE | 10 2004 007209 | 6/2006 |
| EP | 0 452 562 | 10/1991 |
| EP | 1 422 815 | 5/2004 |
| WO | 2008/071713 | 6/2008 |

OTHER PUBLICATIONS

European Patent Office, International Preliminary Report on Patentability, Aug. 21, 2009, from International Patent Application No. PCT/EP2008/004060, filed on May 21, 2008.
European Patent Office, Translation of International Preliminary Report on Patentability, Dec. 3, 2009, from International Patent Application No. PCT/EP2008/004060, filed on May 21, 2008.
Bosch "Kraftfahrtechnisches Taschenbuch", 26. Auflage, Jan. 2007, pp. 903-906.

* cited by examiner

*Primary Examiner* — Melanie Torres Williams
(74) *Attorney, Agent, or Firm* — Kenyon & Kenyon LLP

(57) ABSTRACT

A circuit arrangement for switching two backup valves in a rear axle module of an electronic brake system of a utility vehicle is provided, in which the circuit arrangement includes a switch at which pulse width modulation for controlling magnetic fields of inductors of the two backup valves is applied, and a diode for a slow discharge of the two backup valves in correlation with a predetermined operating state of the two backup valves, in which the diode is connected in parallel with two branches, each containing an inductor of the two backup valves, of the circuit arrangement, and in which the diode switches the two backup valves simultaneously in correlation with the predetermined operating state.

14 Claims, 2 Drawing Sheets

ARRANGEMENT FOR SWITCHING VALVES IN AXLE MODULES OF A UTILITY VEHICLE

FIELD OF THE INVENTION

The present invention relates to a circuit arrangement for switching valves in axle modules of a utility vehicle, and relates in particular to an efficient circuit arrangement of a backup valve output stage of a rear axle module of an electronic brake system of a utility vehicle with a redundant pneumatic backup brake circuit.

BACKGROUND INFORMATION

In addition to an electronic brake system (EBS), utility vehicles also have, for safety reasons, a pneumatic brake system which makes available a redundant function and is used if, for example, the electronic brake system fails. For this purpose, what are referred to as backup valves are arranged on wheel modules of a utility vehicle, which backup valves are energized in the fault-free normal operating mode with the control pressure which is requested by the driver of the utility vehicle, from the compressed air system of the utility vehicle, but said backup valves themselves remain closed. In the event of failure of the electronic brake system, the backup valve is opened and said backup valve applies the brake pressure which is present at it, while the normal inlet and outlet valves are closed.

Such backup valves are generally embodied as solenoid valves which are known per se, and may be used in vehicles, for example utility vehicles, for converting electrical control pulses into, inter alia, hydraulic or pneumatic control pulses for controlling, for example, automatically or electronically controlled transmissions or electronic brake systems.

In this context, rear axle modules in electronic brake systems by which two backup valves are actuated by a control unit by pulse width modulation are known.

If a plurality of valves are present, usually one on each wheel module of the utility vehicle, a plurality of actuation devices have hitherto been used depending on the number of backup valves, for example in each case a separate valve output stage has been used for each backup valve to be actuated, in order to actuate said backup valves independently.

This disadvantageously results in increased expenditure on components as well as more complex actuation, entailing, in particular in the vehicle sector, undesirably high costs and greater expenditure on development. In addition, a larger number of components in the entire system results in a higher risk of failure and therefore can make the vehicle less economically viable.

Furthermore, document U.S. Pat. No. 5,752,482 discusses a load driver system for integrally controlling a current flow through a number of inductive loads of an internal combustion engine such as an injection nozzle coil and a motor brake coil during operation of a motor cylinder, document DE 196 32 365 C1 discusses a circuit arrangement for switching a plurality of parallel inductors independently of one another, document EP-A-1 422 815 discusses a method and a device for actuating an electrical load, in which an energy accumulator takes up the energy of an inductive element when a switch opens, document DE 42 05 563 A1 discloses a solenoid coil for valves with a secondary coil parallel to a temperature-dependent resistor, and document DE 10 2004 007209 B4 discusses a circuit arrangement and a method for determining the load current through an inductive load which is applied to a supply voltage in a clocked fashion.

SUMMARY OF THE INVENTION

The exemplary embodiments and/or exemplary methods of the present invention are therefore based on the object of providing an improved circuit arrangement for switching backup valves in rear axle modules of utility vehicles which requires a reduced number of components for actuating the backup valves and can consequently be manufactured more cost-effectively.

According to the exemplary embodiments and/or exemplary methods of the present invention, this object is achieved by the features described herein as to a first embodiment, and alternatively by the features further described herein as to a second embodiment.

Advantageous developments of the exemplary embodiments and/or exemplary methods of the present invention are further described herein.

A circuit arrangement for switching two backup valves in a rear axle module of an electronic brake system of a utility vehicle is therefore proposed, said circuit arrangement comprising: a switch at which pulse width modulation for controlling magnetic fields of inductors of the two backup valves is applied; and a diode for a slow discharge of the two backup valves in correlation with a predetermined operating state of the two backup valves; wherein the diode is connected in parallel with two branches, each containing an inductor of the two backup valves, of the circuit arrangement, and said diode switches the two backup valves simultaneously in correlation with the predetermined operating state.

In this circuit arrangement, each of the two branches containing an inductor of the two backup valves may also contain a resistor, and in each case one of the two inductors forms, with in each case one of the resistors, a series circuit in the corresponding branch.

A feedback line for feeding back a state of the circuit arrangement is advantageously respectively provided at a first node of the circuit arrangement, which connects a terminal of the diode, of the switch and of the two inductors, at a node of the circuit arrangement between the inductor and the resistor in one of the two branches which are connected in parallel with the diode, and at a node of the circuit arrangement between the inductor and the resistor in the other of the two branches which are connected in parallel with the diode, and a control device senses a fault state of the circuit arrangement by reference to the fed-back state.

Alternatively, a circuit arrangement for switching two backup valves in a rear axle module of an electronic brake system of a utility vehicle, comprising: a switch at which pulse width modulation for controlling magnetic fields of inductors of the two backup valves is applied; and a diode for a slow discharge of the two backup valves in correlation with a predetermined operating state of the two backup valves; wherein the diode is connected in parallel with a branch, containing a series circuit of the two inductors of the two backup valves, of the circuit arrangement, and said diode switches the two backup valves simultaneously in correlation with the predetermined operating state.

In this circuit arrangement, the branch containing the series circuit of the two inductors of the two backup valves may also contain a resistor which in turn forms a series circuit with the series circuit of the two inductors.

In this context, a feedback line for feeding back a state of the circuit arrangement is advantageously respectively provided at a first node of the circuit arrangement, which connects a terminal of the diode, of the switch and of one of the two inductors, at a node of the circuit arrangement between the two inductors and at a node of the circuit arrangement between the second of the two inductors and the resistor in the branch which is connected in parallel with the diode, and a control device senses a fault state of the circuit arrangement by reference to the fed-back state.

The actuation of the switch for generating the common pulse width modulation may be carried out via a pulse width modulation application line.

The switch may also be a rapidly switching field effect transistor.

A terminal of the switch may furthermore be connected to a ground potential.

The pulse width modulation, which is applied to the first switch, may clock the circuit arrangement with a frequency between 1 and 10 kHz.

The diode may be poled in the off direction between a supply voltage and a node of the circuit arrangement which connects a terminal, not connected to a ground potential, of the switch and a terminal of the diode.

Exemplary embodiments of the present invention are described below with reference to the appended drawings.

DETAILED DESCRIPTION

Figure 1:
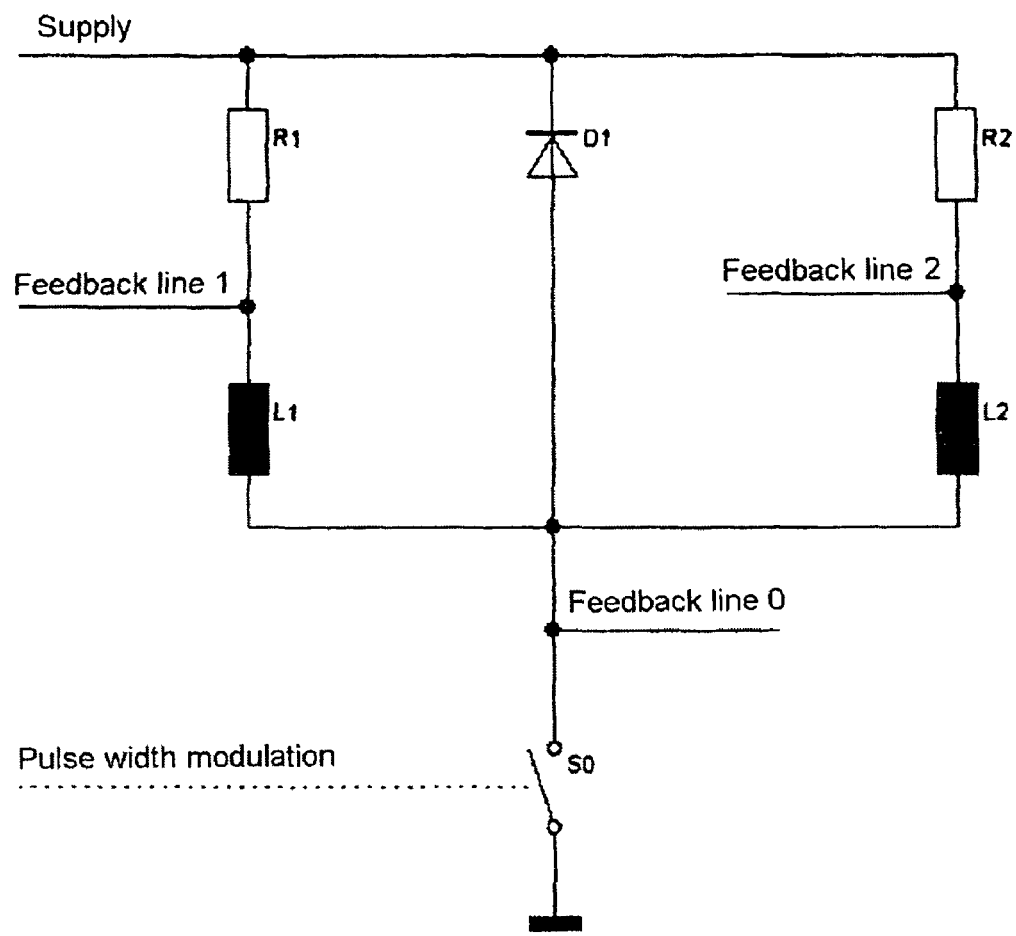
FIG. 1 is a view of a basic circuit arrangement for switching backup valves in rear axle modules of a utility vehicle according to a first exemplary embodiment.

The circuit arrangement which is illustrated in FIG. 1 is suitable for any desired solenoid valves in applications in which magnets are to be switched simultaneously, and said circuit arrangement may be applied in electronic brake systems, but is not restricted thereto.

As is apparent from the simplified circuit arrangement according to FIG. 1, the proposed, efficient solution according to the first exemplary embodiment comprises a switch S0, which may be a field effect transistor, a pulse width modulation line, via which a pulse width modulation for all the backup valves is applied to the switch S0, a diode D1 which serves to slowly discharge the backup valves, a voltage feedback line (feedback line 0), resistors R1 and R2 for current feedback lines (feedback lines 1 to 2) by discharging a current to a control device (not shown). Inductors L1 and L2 which represent the coils of the two backup valves, a supply line (supply) for supplying voltage to the circuit arrangement and a ground terminal.

In particular, the switch S0 and the diode D1 are connected in a series connection in a first branch of the circuit arrangement. In each case a series connection (R1/L1, R2/L2) for in each case one of the backup valves is formed in the first branch, in parallel with the diode D1, wherein a current feedback line is respectively discharged at, in each case, a circuit node between the resistor R1 and the inductor L1 and between the resistor R2 and the inductor L2. In each case a terminal of the resistors R1, R2 and of the diode D1 is connected to the potential of the supply voltage, while in each case a terminal of the inductors L1, L2 and the other terminal of the diode D1 is connected, at a common circuit node, to a terminal of the switch S0 and of the feedback line 0.

The other terminal of the switch S0 is connected to a ground potential of the ground terminal, with the result that the parallel circuit branch composed of the serial circuit branch composed of the inductor L1 and resistor R1, the diode D1 and the serial circuit branch composed of the inductor L2 and resistor R2 can be connected to the ground potential via the switch S0.

With the circuit arrangement shown in FIG. 1 it is advantageously possible to reduce the number of necessary components, since during the actuation of the two backup valves via the rear axle module of the utility vehicle both backup valves are basically always switched together.

The backup valves can be switched here both in parallel and in series without the switching times of the valves changing. In other words, irrespective of the type of connection, the circuit arrangement can be configured without allowing for a change in the switching times, with the result that a change in the reaction time of the brake system does not change when the electronic brake system fails, and a safety-related effect which is possible as a result of this therefore does not occur.

It is noted that the feedback lines R0 to R2 leading to the control device (not shown) permit a fault state to be sensed, wherein the feedback line R0 also constitutes a virtual ground, by virtue of the medium potential generated by the pulse width modulation, and said feedback line R0 therefore ensures a constant voltage across the individual coils/inductors L1, L2 of the solenoid valves.

It is also to be noted that the inductors L1, L2 of the solenoid valves can be arranged either externally or, for example in electronic brake systems, internally in the solenoid valve body.

A series circuit like the one mentioned above is illustrated in FIG. 2 as an alternative exemplary embodiment. Here, identical reference signs denote identical elements to those in FIG. 1, so that a renewed description of such elements is omitted.

Figure 2:
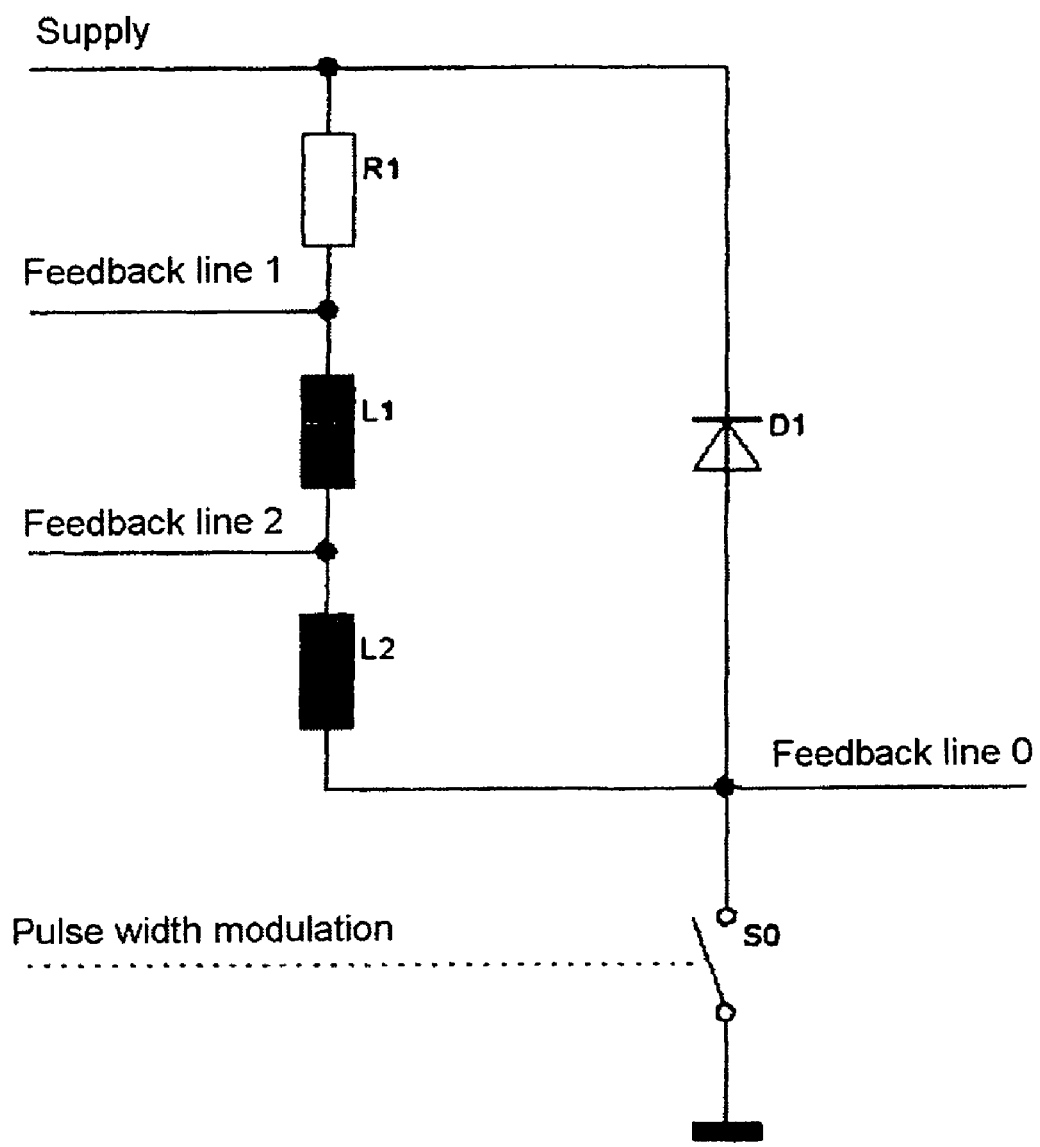
FIG. 2 is a view of an alternative, basic circuit arrangement for switching backup valves in rear axle modules according to a second exemplary embodiment.

The circuit arrangement illustrated in FIG. 2 is also suitable for any desired solenoid valves in applications in which magnets have to be switched simultaneously, and it may be applied in electronic brake systems without being restricted thereto.

As is apparent from FIG. 2, a series circuit is composed of a resistor R1, an inductor L1 and an inductor L2 are connected in parallel with the diode D1. In other words, one of two branches located in parallel with the diode D1 in FIG. 1 and each composed of a series circuit composed of an inductor and a resistor, has been replaced by a single branch connected in parallel with the diode D1 composed of a resistor R1 and the two inductors L1, L2 which represent the coils of the two backup valves.

It is noted that in this exemplary embodiment the resistor R1 also serves to generate a current feedback line to a control device but the individual feedback lines 1 and 2 are discharged, on the one hand, at a circuit node between the resistor R1 and the inductor L1 of one of the two backup valves (feedback line 1) and, on the other hand, at a circuit node between the inductor L1 of one of the two backup valves and the inductor L2 of the other of the two backup valves (feedback line 2).

The remaining arrangement in the alternative solution shown in FIG. 2 corresponds to that of the first exemplary embodiment according to FIG. 1.

In accordance with the preceding description of two exemplary embodiments, the present invention provides the following solutions and remedies for known arrangements.

The first exemplary embodiment shown in FIG. 1 and the second exemplary embodiment shown in FIG. 2 have significant advantages over the previously known solutions to the extent that just one extinguishing diode D1 is required for two backup valves with the inductors L1, L2, and that just one high-speed switch S0 is necessary to generate the pulse width modulation.

Furthermore, in the case of the exemplary embodiment shown in FIG. 2, there is, compared with that in FIG. 1, an advantageous, even better reduction in the necessary number of components as a result of the resistor R2 also being eliminated.

Overall, the proposed circuit arrangement provides a significant reduction in the expenditure on components and parts by virtue of the fact that a plurality of solenoid valves which are to be switched are combined. Here, the circuit arrangement is not restricted to a specific type of valves but rather can be applied for any desired valves which are to be switched electrically or electronically.

Structural ways of implementation which are similar to the detailed description of the exemplary embodiments are already identifiable to a person skilled in the art and are not to be considered as deviations from the subject matter of the exemplary embodiments and/or exemplary methods of the present invention as defined herein.

A circuit arrangement for switching two backup valves has therefore been described in a rear axle module of an electronic brake system of a utility vehicle, comprising: a switch S0 at which a pulse width modulation for controlling magnetic fields of inductors L1, L2 of the two backup valves is applied; and a diode D1 for a slow discharge of the two backup valves in correlation with a predetermined operating state of the two backup valves; wherein the diode D1 is connected in parallel with two branches of the circuit arrangement which each contain an inductor L1, L2 of the two backup valves, and the said diode D1 switches the two backup valves simultaneously in correlation with the predetermined operating state. In one alternative embodiment, the inductors L1, L2 are connected in series in just one branch which is connected in parallel with the diode D1.

A list of the reference symbols is as follows:

| | |
|---|---|
| Supply | Common supply line; |
| Feedback lines 0 to 2 | Feedback lines; |
| S0 | Switch; |
| L1, L2 | Inductors; |
| R1, R2 | Resistors; |
| D1 | Diode; and |
| Pulse width modulation | Pulse width modulation application line. |

The invention claimed is:

1. A circuit arrangement for switching two backup valves in a rear axle module of an electronic brake system of a utility vehicle, comprising:
a first backup solenoid valve in the redundant pneumatic brake system having a first inductor in a first circuit component branch of the circuit arrangement;
a second backup solenoid valve in the redundant pneumatic brake system having a second inductor in a second circuit component branch of the circuit arrangement;
an extinguishing diode for the first backup solenoid valve and the second backup solenoid valve in a third circuit component branch of the circuit arrangement for a slow discharge of the first and second backup solenoid valves when the first and second backup solenoid valves are opened in a redundant operating mode in order to apply a pneumatic brake pressure when the electronic brake system fails; and
a switch in a fourth circuit component branch of the circuit arrangement, by which switch pulse width modulation for controlling the magnetic fields of the first inductor and the second inductor of the first and second backup solenoid valves is applied;
wherein the first and second inductors in the first and second circuit component branches of the circuit arrangement and the extinguishing diode in the third circuit component branch of the circuit arrangement are connected in parallel with one another,
wherein the first and second inductors are connected to a supply voltage of the circuit arrangement at a first common circuit node via a first and a second resistor in the first and second circuit component branches of the circuit arrangement and the extinguishing diode in the third circuit component branch of the circuit arrangement, and the first and second inductors and the extinguishing diode are connected to a first terminal of the switch at a second common circuit node at an intermediate potential between the supply voltage and a ground potential of the circuit arrangement,
wherein the cathode of the extinguishing diode is connected to the supply voltage, and the anode of the extinguishing diode is connected to the intermediate potential, and
wherein the switch in the fourth circuit component branch is connected in series with the parallel circuit of the first, second and third circuit component branches between the intermediate potential and the ground potential, and the switch switches simultaneously the two backup solenoid valves in the redundant operating mode.

2. The circuit arrangement of claim 1, wherein the first circuit component branch containing the first inductor contains the first resistor which forms, with the first inductor, a first series circuit in the first circuit component branch, and the second circuit component branch containing the second inductor contains the second resistor which forms, with the second inductor, a second series circuit in the second circuit component branch.

3. The circuit arrangement of claim 2, wherein a feedback line for feeding back a state of the circuit arrangement is respectively provided in the first series circuit, between the first inductor and the first resistor, and in the second series circuit, between the second inductor and the second resistor, and a control device senses a fault state of the circuit arrangement by reference to a fed-back state.

4. The circuit arrangement of claim 1, wherein the actuation of the switch for generating the common pulse width modulation is carried out via a pulse width modulation application line.

5. The circuit arrangement of claim 1, wherein the switch is a rapidly switching field effect transistor.

6. The circuit arrangement of claim 1, wherein a terminal of the switch is connected to a ground potential.

7. The circuit arrangement of claim 1, wherein the pulse width modulation which is applied to the first switch clocks the circuit arrangement with a frequency between 1 and 10 kHz.

8. A circuit arrangement for switching two backup valves in a rear axle module of an electronic brake system of a utility vehicle, comprising:
a first backup solenoid valve in the redundant pneumatic brake system with a first inductor in a first circuit component branch of the circuit arrangement;
a second backup solenoid valve in the redundant pneumatic brake system with a second inductor in the first circuit component branch of the circuit arrangement;

an extinguishing diode for the first and second backup solenoid valves in a second circuit component branch of the circuit arrangement for a slow discharge of the first and second backup solenoid valves when the first and second backup solenoid valves are opened in a redundant operating mode to control a pneumatic brake pressure when the electronic brake system fails; and a switch in a third circuit component branch of the circuit arrangement by which pulse width modulation is applied to control the magnetic fields of the first and second inductors of the first and second backup solenoid valves;

wherein the first and second inductors in the first circuit component branch of the circuit arrangement are connected in series with one another, and the extinguishing diode in the second circuit component branch of the circuit arrangement is connected in parallel with the series circuit of the first and second inductors in the first circuit component branch of the circuit arrangement, wherein the first inductor is connected to a supply voltage of the circuit arrangement at a first common circuit node via a resistor in the first circuit component branch of the circuit arrangement and the extinguishing diode in the second circuit component branch of the circuit arrangement, and the second inductor. and the extinguishing diode are connected to a first terminal of the switch at a second common circuit node at an intermediate potential between the supply voltage and a ground potential of the circuit arrangement, wherein a cathode of the extinguishing diode is connected to the supply voltage, and an anode of the extinguishing diode is connected to the intermediate potential, and wherein the switch in the third circuit component branch is connected in series with the parallel circuit of the first and second circuit component branches between the intermediate potential and the ground potential, and the switch switches the two backup solenoid valves simultaneously in the redundant operating mode.

9. The circuit arrangement of claim 8, wherein the first circuit component branch containing the series circuit of the first and second inductors of the two backup solenoid valves contains the resistor which forms a series circuit with the series circuit of the first and second inductors.

10. The circuit arrangement of claim 9, wherein a feedback line for feeding back a state of the circuit arrangement is respectively provided between the first inductor and the second inductor the first parallel circuit component branch and between the first inductor and the resistor in the first parallel circuit component branch, and a control device senses a fault state of the circuit arrangement by reference to the fed-back state.

11. The circuit arrangement of claim 8, wherein the actuation of the switch for generating the common pulse width modulation is carried out via a pulse width modulation application line.

12. The circuit arrangement of claim 8, wherein the switch is a rapidly switching field effect transistor.

13. The circuit arrangement of claim 8, wherein a terminal of the switch is connected to a ground potential.

14. The circuit arrangement of claim 8, wherein the pulse width modulation which is applied to the first switch clocks the circuit arrangement with a frequency between 1 and 10 kHz.

* * * * *